United States Patent [19]

Geissberger et al.

[11] Patent Number: 4,965,218

[45] Date of Patent: Oct. 23, 1990

[54] SELF-ALIGNED GATE REALIGNMENT EMPLOYING PLANARIZING OVERETCH

[75] Inventors: Arthur E. Geissberger; Robert A. Sadler, both of Roanoke; Paulette Luper, Salem; Matthew L. Balzan, Roanoke, all of Va.

[73] Assignee: ITT Corporation, New York, N.Y.

[21] Appl. No.: 235,393

[22] Filed: Aug. 23, 1988

Related U.S. Application Data

[60] Division of Ser. No. 137,309, Dec. 23, 1987, Pat. No. 4,847,212, and a continuation-in-part of Ser. No. 2,084, Jan. 12, 1987, abandoned, said Ser. No. 137,309, is a continuation-in-part of Ser. No. 2,083, Jan. 12, 1987, Pat. No. 4,782,032, Ser. No. 2,084,, Ser. No. 4,992, Jan. 20, 1987, and Ser. No. 113,367, Oct. 21, 1987, which is a continuation of Ser. No. 789,523, Oct. 21, 1985, abandoned.

[51] Int. Cl.$^5$ ............................................ H01L 21/338
[52] U.S. Cl. ........................................ 437/41; 437/195; 437/228; 437/912; 437/177; 156/653
[58] Field of Search ............... 437/175, 176, 177, 178, 437/179, 41, 200, 201, 192, 228, 229, 195, 225, 912; 357/15, 22; 156/653

[56] References Cited

U.S. PATENT DOCUMENTS

| | | | |
|---|---|---|---|
| 4,080,719 | 3/1978 | Wilting | 437/178 |
| 4,213,840 | 7/1980 | Omori et al. | 437/177 |
| 4,614,021 | 9/1986 | Hulseweh | 437/189 |
| 4,650,543 | 3/1987 | Kishita | 437/192 |
| 4,735,913 | 4/1988 | Hayes | 437/192 |
| 4,755,478 | 7/1988 | Abernathey et al. | 437/41 |

FOREIGN PATENT DOCUMENTS

| | | | |
|---|---|---|---|
| 0147137 | 8/1985 | Japan | 437/177 |
| 0067272 | 4/1986 | Japan | 437/177 |

OTHER PUBLICATIONS

Howes et al., Gallium Arsenide, Materials, Devices & Circuits, John Wiley & Sons, 1985, pp. 370-371.

*Primary Examiner*—Brian E. Hearn
*Assistant Examiner*—T. N. Quach
*Attorney, Agent, or Firm*—Thomas N. Twomey

[57] ABSTRACT

A method of providing a self-aligned gate (SAG) transistor or FET is disclosed. The method permits large aligment tolerances during manufacture of the SAG FET. A reduction in gate resistance is accomplished by including a second layer of gate metallization, which is highly conductive, after the n+ implant and activation anneal without any critical realignment to the first layer of gate metal. The provision of the second layer after the anneal precludes degradation of the conductivity of the second gate metal by interdiffusion with the first (refractory) gate metal during the anneal. The large tolerance for misalignment of the gate mask level is obtained by a planarization of the anneal cap until the top surface of the first layer of gate metal is exposed, all without the need for a separate mask and etch step to open contact "windows" through the planarization anneal cap layers. The remaining adjacent encapsulant then acts as an insulator over the FET channel region and allows for gross misalignment of the second gate metallization without FET performance degradation. Using this technique, substantially increased performance can be obtained from a self-aligned FET while maintaining the basic simplicity of the RG process.

5 Claims, 4 Drawing Sheets

SELF-ALIGNED GATE REALIGNMENT EMPLOYING PLANARIZING OVERETCH

RELATED APPLICATIONS

This application is a continuation-in-part of commonly owned U.S. patent application No. 002,084, filed Jan. 12, 1987, now abandoned, and a division of commonly owned U.S. patent application No. 137,309, filed Dec. 23, 1987, now issued as U.S. Pat. No. 4,847,212, which was itself a continuation-in-part of each of U.S. patent application No. 002,083, filed Jan. 12, 1987, now issued as U.S. Pat. No. 4,782,032, U.S. patent application No. 002,084 (identified above), U.S. patent application No. 004,992, filed Jan. 20, 1987, currently pending, and U.S. patent application No. 113,367, filed Oct. 21, 1987, currently pending, the latter application being a continuation of U.S. patent application No. 789,523, filed Oct. 21, 1985, now abandoned.

BACKGROUND AND SUMMARY OF THE INVENTION

This invention relates to gallium arsenide (GaAs) field-effect transistors (FET's) and to methods of making such transistors. More particularly, this invention is concerned with a method for making self-aligned gate (SAG) GaAs transistors for use in the integrated circuit field.

The processes currently being used fall into two categories: (1) Thermally-Stable Refractory Gate (RG), and (2) Substitutional Gate (SG). From a processing standpoint, the RG process is simpler and easier to manufacture than the SG process, but it places stringent requirements on the thermal stability of the Schottky gate metallization. The SG approach places no unusual thermal stability requirements on the gate metal but does require the difficult formation of a tri-layer gate substitution mask with a carefully controlled T-shaped profile.

While the RG approach may be superior overall to the SG approach, previous embodiments of the RG approach have suffered the need to compromise some aspects of the process due to inadequate technology. One major problem in the past has been that the thermal stability of the gate metal is insufficient to permit annealing of the self-aligned n+ implant at temperatures higher than 750° C.-800° C., whereas optimum activation of the channel implants of the device occurs at temperatures above 800° C. and are generally in the range between about 810° C.-850° C. for furnace anneals and generally above 900° C. for RTA (rapid thermal annealing). This necessitates one of two possible compromises: either annealing both the initial channel implant and the subsequent device region at an annealing temperature compatible with the n+ implanted regions, or doing two separate anneals, a channel anneal before gate formation at an optimum time-temperature product and then a source/drain anneal at a lower than optimum temperature. In either case, the implant activation and electron mobility in the source and drain implant regions suffer, so that the FET characteristics are less than optimum.

Another disadvantage of some embodiments of the RG approach is the use of a photoresist mask to plasma etch the refractory gate metal. Thus, since this approach results in an FET without an overhanging "T-gate" structure, it allows no means to space the position of the gate from the edges of the self-aligned n+ regions, and therefore no means to optimize the gate structure simultaneously with respect to both capacitance (Cgd) and series resistance.

In the SG process, gold is used as the refractory metal since it exhibits low resistivity and its thermal stability is sufficient for that process. However, in the RG process, the refractory metals used must be such that they can achieve the necessary thermal stability of the gate Schottky contact. Gold is not a suitable metal for this process. Another problem in the past has been the high resistivity of the refractory metals suitable for the RG process relative to that of gold. The high resistivity of the refractory gate metallization complicates the RG approach in that the first level interconnect metal, which must have lower resistivity than possible with a refractory metal, is defined by an additional mask level rather than the gate mask level as in the SG process. Also the high gate resistance degrades the performance of RG processed FET's, which precludes using this highly manufacturable process to fabricate high frequency analog circuits.

Previous SAG FET's have employed a symmetrical structure, with highly doped n+ regions on either side of the self-aligned gate electrode. Although this structure is relatively simple to fabricate, it has several disadvantages. First, the close proximity of the implanted n+ drain region to the drain side of the gate causes a large reduction in the gate-drain breakdown voltage, which severely limits the ultimate power-handling capability of the FET. Furthermore, the high doping of the implanted n+ drain region and its proximity to the gate metallization increases the gate-drain capacitance. Finally, the close spacing between source and drain n+ regions increases the parasitic substrate current, thereby decreasing the output resistance of the FET. All of these have adverse effects on the performance of a self-aligned FET when used in either analog or digital circuits, but the use of a self-aligned FET to handle high-frequency analog signals is particularly impaired by the above disadvantages of a symmetrical device structure.

It is therefore an object of the present invention to provide a self-aligned gate type GaAs field-effect transistor which overcomes the disadvantages of the prior art.

It is an additional object of the present invention to provide a refractory gate metallization with high thermal stability.

It is yet another object of the present invention to provide a method of manufacturing a GaAs field-effect transistor using a single annealing step.

It is an additional object of the present invention to provide a method of producing GaAs field-effect transistors in which the manufacturing yield is increased and the product cost is decreased.

It is still a further object of the invention to provide a GaAs FET manufacturing process which permits the use of a high-resolution positive photoresist to define a metal etch mask in a liftoff sequence.

It is another object of the present invention to provide a FET which allows gate line widths of 1 micrometer or less to be easily defined optically.

It is yet another object of the present invention to provide an oversize metal mask for gate definition which serves as an implant mask for highly doped source and drain implants thereby allowing the creation of an implant-to-implant spacing larger than the gate length.

It is an additional object of the invention to provide a refractory gate metallization which simultaneously provides both a high-temperature stable Schottky barrier and an equally high-temperature stable diffusion barrier between gold (Au) and GaAs.

It is still another object of the invention to provide a diffusion barrier to Au at operating temperature to improve device lifetime from an electromigration perspective especially for Power FET's, i.e. up to 2 watts or more and 800 mw/mm of gate periphery (gate width).

It is a still further object of the present invention to permit the use of Au as an etch mask to fabricate a T-gate structure for use as a self-aligned implantation mask and leave the Au in place during the activation anneal to reduce the gate resistance of the FET.

It is yet another object of the present invention to use a refractory metal/Au layered structure for simultaneous formation of both the gate metal and first-level interconnect metal to increase the throughput of GaAs IC's and reduce the cost of fabrication.

It is another object of the present invention to improve the high frequency performance of refractory gate GaAs FET's by reducing the gate resistance.

It is yet another object of the invention to allow the application of the highly manufacturable RG process to the fabrication of analog FET's and MMICS.

A further object is to provide a SAG FET gate metallization which has very low gate resistance.

Still a further object of the invention is to fabricate SAG analog and digital FET's on the same integrated circuits.

Another object of the invention is to planarize a dielectric anneal encapsulant overlying a first level gate metallization of refractory metal by plasma etching to expose the top of the first layer gate metallization prior to formation of a second layer of gate metallization.

It is an additional object of the present invention to provide a self-aligned device structure in which a highly doped n+ region is present between the source and gate electrodes, but is not present in a channel region laterally adjacent to the gate electrode on the drain side of the gate.

It is an additional object of the present invention to provide a method of producing self-aligned gate field-effect transistors in which the output resistance and the gate-drain breakdown voltage are increased and the gate-drain capacitance is decreased.

It is also an object of the invention to provide a method of producing FET's having improved source-drain breakdown voltage.

It is another object of the invention to provide an FET which allows gate line widths of 1 micron or less to be easily defined optically, using 1 micron masks.

These and other objects of the invention which will become apparent hereinafter are accomplished by the present invention which provides a process for making a field-effect transistor comprising one or more of the structural and process innovations of the present invention including: (i) the step of heating a gallium arsenide substrate having first channel forming and second source-drain forming ions implanted therein and a high temperature resistant metallization layer used to self-align the source and drain implants, where the metallization layer includes 1 to 20 atomic percent titanium and includes tungsten, and the metallization layer is deposited on the substrate and heated to a high temperature sufficient to anneal the ion implanted regions of the substrate and activate the ions implanted therein; (ii) the step of forming a gate metallization layer on said substrate which layer is fabricated from titanium-tungsten nitride (TiWN$_x$) and is used both as a diffusion barrier between a gold conductor and the GaAs channel of the transistor and as a Schottky junction forming refractory gate; (iii) masking of a portion of the channel region on the drain side of the gate electrode before performing an n+ self-aligned source and drain implant, so that the n+ implanted source-drain region is asymmetrical on the two sides of the gate electrode to obtain minimum desired parasitic source resistance, without the deleterious effects on gate-drain breakdown voltage, gate-drain capacitance, source-drain breakdown voltage, and output resistance that accompany a high doping level adjacent to the drain side of the gate; iv) overcoming the disadvantage of the high gate resistance for a Thermally-Stable Refractory Gate SAG FET while maintaining large alignment tolerances and reducing gate resistance by including a second gate metallization layer, which has a higher conductivity than the refractory gate layer and which may be formed after the n+ self-aligned source/drain implant and preferably after the activation anneal thus precluding degradation of the conductivity of the second gate metal by interdiffusion with the first (refractory) gate metal during activation. A large tolerance for misalignment of the gate mask level may be obtained by a planarization etch of the anneal cap which is continued long enough to expose the top surface of the first gate metallization. This may be done without any initial aperture delineation for the gate since the vertical height of the gate metal causes the gate to be the highest physical structure on the chip surface and thus to become exposed first during the planar etch. The remaining encapsulant adjacent the sides of the first gate metallization layer then acts as an insulator over the FET channel region and other portions of the substrate and allows for gross misalignment (±0.5 micron) of the second gate metallization layer without FET performance degradation. Using this innovation for reducing resistance in a refractory gate substantially increases performance of self-aligned GaAs devices while maintaining the basic simplicity of the RG process.

BRIEF DESCRIPTION OF THE DRAWING

The above-mentioned and other features and objects of this invention will become more apparent by reference to the following description taken in conjunction with the accompanying drawings, in which:

FIG. 3 consists of FIGS. 3a and 3b;

FIG. 11 consists of FIGS. 11a and 11b while FIG. 13 consists of FIGS. 13A, 13B and 13C;

DETAILED DESCRIPTION OF THE PREFERRED EMBODIMENT

Figure 1:
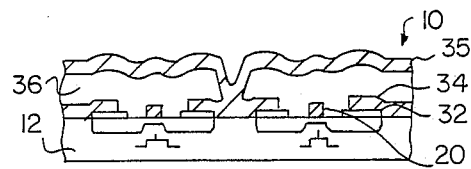
FIG. 1 is a schematic sectional view of a field-effect transistor produced in accordance with the present invention.

FIG. 1 shows the structure of a self-aligned gate field-effect transistor in accordance with the present invention generally indicated by 10.

Figure 2:
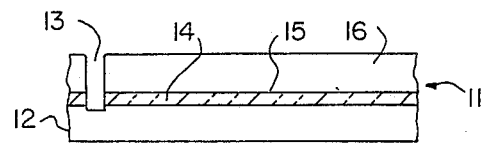
FIGS. 2 through 7 show sequential stages in a process of forming a field-effect transistor in accordance with the invention.

Processing of a semiconductor wafer 11 is illustrated, commencing in FIG. 2, where a gallium arsenide (GaAs) substrate 12 is initially cleaned in solvents and then etched to remove that portion of the substrate 12 which may have been damaged by the use of a mechanical slurry polishing process. It has been found that by removing at least approximately 5 micrometers from each of the substrate surfaces, the damaged portion will be removed and improved electrical properties will result. A problem in removing the material from the substrate is that a pitted or rough-textured surface may result with certain etchants. A preferred etchant which avoids this problem is a mixture of sulfuric acid, hydrogen peroxide and water ($H_2SO_4:H_2O_2:H_2O$) in a ratio of 5:1:1, used at a temperature in the range of approximately 30° C.–40° C. This etchant does not damage the wafer 11 and leaves a smooth finish on the surfaces of the wafer 11 which aids in further processing of the wafer, especially when performing photolithography.

A dielectric layer 14 which will serve as a passivation layer for the GaAs is formed on one surface of the substrate 12 with 900 Å or less of a suitable dielectric material. The preferred materials for the dielectric layer 14 are silicon nitride (SiN), silicon oxynitride (SiON) and silicon dioxide ($SiO_2$). The formation of the dielectric layer 14 protects the substrate surface by isolating it from, for instance, photoresist residues during subsequent processing. The dielectric layer 14 may, however, be eliminated so that ion implants can be made directly into the bare GaAs surface, or the GaAs surface having only a thin native oxide formed thereon.

A photoresist layer 16 is formed on one surface 15 of the dielectric layer 14. The photoresist layer 16 is patterned for registration marks 13 which will serve alignment marks on the wafer 11 for alignment of masks, etc. for instance for patterning of implant areas later in the process. The pattern of registration marks 13 is etched into the dielectric layer 14 and then into the underlying GaAs substrate 12. After etching of the alignment marks, the photoresist layer 16 is removed, preferably with an oxygen plasma.

Figure 3A:
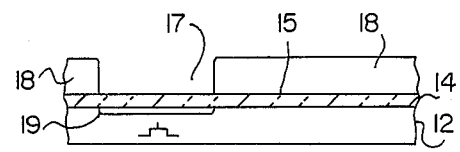

Another photoresist layer 18 is formed on the surface 15 as shown in FIG. 3a. The photoresist layer 18 is patterned to form one or more windows 17 for selective ion implantation through the dielectric layer 14 into the underlying GaAs substrate 12. Patterning is performed in any known manner. Typically, a photographic mask having the desired pattern is positioned on the photoresist layer 18, aligning registration marks on the mask with the registration marks on the substrate 12. The photoresist 18 is exposed to light through the mask, and then the mask is removed. A solvent is applied so that the exposed areas of the resist are dissolved and washed away and the unexposed resist remains to serve as an implant mask. This photolithographic patterning can be performed equally well employing alternative photoresist techniques.

The ion implantation step is performed in any known manner. In one method, the wafer 11 is supported in a vacuum chamber and a beam of ions is uniformly swept over it and implanted into the GaAs substrate 12 through the window 17. The implanted region is indicated at 19. The material of the dielectric layer 14 preferably has an amorphous structure, thus minimizing planar channeling effects of the arriving ions through the layer 14. If somewhat steeper implant profiles are desired, the dielectric layer 14 may be eliminated or reduced in thickness to about 300 Å since some dielectric covering is very useful for protecting the GaAs during photoresist stripping, and the implant made directly (or less indirectly) into the GaAs substrate 12. After the implant is performed, the photoresist layer 18 is removed, for instance, in an oxygen plasma.

Additional selective implant steps may be performed by forming another photoresist layer (not shown) on top of the dielectric layer 14, patterning the photoresist layer to form new window areas and implanting the desired dopant material through the new window areas into and through the dielectric layer 14 and into the GaAs substrate 12. The additional photoresist is thereafter removed. Thus, many different types of active and passive devices can be fabricated on the same wafer, for example, enhancement-mode and depletion-mode FET's, diodes and resistors. This is made possible by the formation, in the GaAs substrate, of multiple ion implanted regions having different impurities and/or impurity concentrations.

After completing the desired selective implant steps, the dielectric layer 14 is removed in a suitable manner for the dielectric employed. For $SiO_2$, a hydrogen fluoride (HF) etch is satisfactory. A metallization layer 20 is formed on a surface 26 which includes the implanted surface of the wafer 11. The metallization layer 20 may be formed of titanium-tungsten (TiW). One method of formation of the layer 20 is accomplished by the sputter deposition of titanium-tungsten to a depth of 2000 Å. Known metallization layers consist of titanium and tungsten in an atomic ratio of 30:70. This is equivalent to 10 weight percent titanium and 90 weight percent tungsten. Sputter targets of this composition were originally employed in the silicon semiconductor industry to sputter deposit a titanium-tungsten diffusion barrier layer between, for example, aluminum and polysilicon. When these sputter targets were used in the gallium arsenide industry to deposit titanium-tungsten to form a temperature-stable Schottky contact, it was found that annealing at temperatures higher than 800° C. caused degradation of the electrical properties of the TiW:-GaAs Schottky barrier. However, activation efficiency of silicon as an n-type dopant generally requires annealing at temperatures above 800° C. It therefore became necessary to perform two annealing steps—one, prior to gate formation, at a temperature of 830° C.–850° C. to achieve optimum activation of the channel implants and a second after any required high-dose ion implants for source and drain optimization, at a lower temperature of 750° C.–800° C. to prevent functional degradation of the then present Schottky gate. The second low-temperature annealing resulted in less than optimum levels of implant activation and electron mobility in the source and drain regions for the following reasons. Typically, silicon is used as an ion-implanted dopant for GaAs. Silicon is amphoteric and thus can act as an n-type and a p-type dopant depending upon whether it bonds into a Gallium site (n-type) or an Arsenic site. Annealing time and temperature will determine whether the silicon bonds predominantly into Gallium sites to act as an electron donor (n-type) or into Arsenic sites to act as an electron acceptor (p-type). At certain annealing times and temperature products the portion of silicon atoms which become electron donors is maximized. This is the desired condition since n-type GaAs material has higher electron mobility. There is an optimum anneal schedule well known in the semiconductor industry where temperatures between about 800° C. and 950° C. and for times between about 10 and 30 minutes will increase n/p type activation. Rapid thermal annealing may also be employed according to schedules known for RTA anneals, including temperatures as high as 1050° and times as short as 10 seconds. A second anneal, following a first optimum anneal, degrades the n/p activation ratio initially obtained. Thus, the second anneal is typically conducted at lower temperatures, i.e. about 800° C. for about 10 minutes, which is less than optimum (i.e. 810° C. for 20 minutes). Thus, the source and drain $n+$ activation is not optimized. For the channel, 90% efficiency (n/p) is desired. Thus, annealing at the required lower temperature results in less than optimum implant activation efficiency and electron mobility in the $n+$ regions.

Unexpectedly, it has been found that a mixture of 1 atomic percent titanium to 20 atomic percent titanium with a respective 99 to 80 atomic percent tungsten ratio in the deposited layer 20 gives thermal stability to the layer so that it can withstand furnace annealing at temperatures between 800° C.–950° C. without degradation of the electrical properties of the titanium-tungsten:gallium arsenide Schottky barrier. Preferably, annealing is performed at temperatures in the range of approximately 810° C.–850° C. to achieve optimum ion implant activation. Due to the thermalstability of the metallization layer 20 at high temperatures, it became possible to perform only one annealing step at the higher temperatures, resulting in optimum activation of both implants, increased electron mobility and therefore reduced parasitic resistances and higher transconductance. Other improved FET characteristics which result from the single higher-temperature annealing step include operation of the device at a lower drain-source bias voltage which results in low power dissipation relative to operation under higher bias conditions, or faster switching time with the same power dissipation and bias level. With increases in the percentage of titanium in the mixture, the thermal stability begins to degrade due to TiAs compound formation at the metal to semiconductor interface. Thus, with the reduced titanium level, the stability of the TiW during high temperature processing is achieved.

One way of achieving reduced atomic percent titanium in the metallization layer is by changing the sputter conditions. In a typical sputtering process, the wafer 11 is placed in a vacuum chamber and a 30:70 (atomic ratio) TiW target electrode is used as a cathode in a DC or RF circuit. Argon gas is passed into the chamber at a low pressure and the TiW cathode is bombarded, releasing TiW onto the wafer 11. By changing certain sputter conditions including the pressure conditions inside the chamber and the biasing of the wafer 11, the ratio of atoms of titanium can be reduced from 30 per hundred resulting in improved thermal stability of the deposited layer. At a pressure of 10 mTorr and biasing of the wafer at about 220 volts higher than the target electrode, 5–10 atomic percent Ti is obtained in the sputtered metal. It has been found that even without substrate bias, it is possible to form the gate with lower Ti content than in the target when low pressure, i.e. 10 mTorr, is maintained and about a 2 KW target supply and 0–1 KW substrate supply are provided.

Figure 3B:
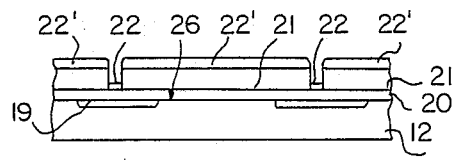
Figure 4:
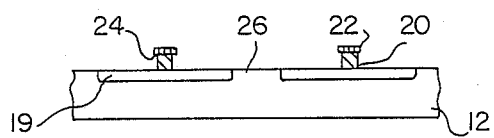

Referring to FIG. 3b and 4, the next step in wafer processing is the patterning of the gate structures 24 which begins with the formation of another masking level on the TiW layer 20. This masking level is a metal etch mask 22 formed and then patterned by liftoff in the following manner. A high resolution positive photoresist or alternatively an image reversal photoresist mask 21 is positioned directly on top of the TiW layer 20. The photoresist is patterned such that the mask 21 has openings which define the regions where a metal is to be retained to thus form the etch mask 22. The metal for the etch mask 22 is evaporated on the positive photoresist mask in such a manner that the top surface of the photoresist is covered and the openings in the photoresist mask are filled. After evaporation, the photoresist mask is chemically etched away and the metal 22' over the photoresist is lifted off. The metallization 22 remaining on the TiW layer 20 is the metal etch mask 22. Preferred materials for the etch mask 22 are nickel and aluminum, although as explained herein, gold may also be employed.

It has been found that the use of a high-resolution positive photoresist or an image reversal resist (IR resist) to define a metal etch mask by evaporation and liftoff enables gate linewidths of 1 micrometer or less to be defined much more easily than with the use of a photoresist etch mask with currently available photoresists. IR resist withstands an RIE much better than standard positive resist, but the metal etch mask is better still. In addition, the metal etch mask 22 serves as an excellent implant mask as discussed below. In the event that photoresists are identified which have satisfactory resolution and masking properties, then such photoresist could conveniently be used in place of the metal etch mask described above.

The TiW layer 20 is then reactive-ion etched, using the metal mask 22 as an etch mask, in a fluorine-based plasma. The plasma will etch the TiW layer 20 in the regions not covered by the metal etch mask 22 and is preferably tailored so it will also undercut the masked region to form T-shaped structures 24 as shown in FIG. 4. The amount of plasma undercut can be controlled by varying the plasma etch parameters. This can be accomplished by initially etching at low pressure to set an anisotropic profile, then increasing the pressure to cause isotropic etching and achieve a plasma undercut. Alternatively, a single step of RIE can be made to commence in an anisotropic mode and increase its rate of undercut when the surface is cleaned and species depletion no longer exists. Termination of the etch is triggered by disappearance of the nitrogen atomic absorption line in conventional optical endpoint detection equipment.

Figure 5:
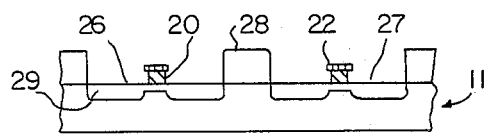

Following the gate patterning, a photoresist mask 28 is formed on the surface 26 to define regions 29 for a self-aligned ion implant as shown in FIG. 5. The term "self-aligned" is used since the mask 22 acts as a barrier to ion implantation and thus defines the limits of heavily doped regions to be formed in the substrate. While n-type doping is employed for the channel at a level which will form good Schottky contact, much higher levels of n-type doping ($n+$) are desired from this second implant step to form more highly conductive source and drain regions and to facilitate ohmic contact. Although p and $p+$ implants may be used for Schottky contact and ohmic contact, respectively, n-type doping permits much faster carrier transport in GaAs, as explained previously, and is thus preferred.

The photoresist mask 28 is formed by depositing a layer of a positive photoresist on the wafer 11 and exposing the photoresist 28 through a mask (not shown) in those areas in which the n+ implant is desired. The mask and the exposed portion of the photoresist are removed. Windows 27 for the high-dose ion implant are thereby formed on the surface 26 of the wafer 11. The metal etch mask 22 serves as a self-aligned masking structure for the ions which are directed to the window regions. The ions will be implanted in the regions at both sides of the T-shaped structures 24, with a small lateral separation between each gate edge and adjacent n+ regions due to the mask 22 being wider than the gate 20 as a result of the undercutting during etching. The metal etch mask 22 allows the creation of an n+ implant-to-implant spacing larger than the gate length. This is a desirable feature of an optimized GaAs SAG process, since only by controlling the difference between these two dimensions can the device be optimized in the trade-off between gate capacitance and breakdown voltage versus parasitic series resistance.

The n+ implant is masked from the region of the T-shaped structures 24 by the etch mask 22, with the separation of each gate edge from the adjacent n+ region determined by the plasma undercut of the gate metal. The plasma undercut can be controlled accurately enough during etching to allow optimization of the gate structure with respect to both gate capacitance and series resistance. The photoresist mask 28 is removed in an $O_2$ plasma, and the etch mask 22 is dissolved in hydrochloric acid at 55° C., which also removes any photoresist residues which may remain.

The wafer is then covered with approximately 5000 Å or less of a dielectric encapsulant 30 and annealed at approximately 810° C. for about 20 minutes. The encapsulant 30 is provided to protect the GaAs wafer 11 from disassociation since the arsenic may otherwise vaporize at the high annealing temperature. Because the atomic ratio of the TiW elements enables the layer 20 to have unusually high thermal stability, only one annealing step for both channel and source-drain n+ implants is needed. As discussed above, this allows optimum n/p activation of each implant, thus higher electron mobility, reduced parasitic resistances as well as superior device characteristics may be obtained. It also eliminates one annealing furnace and the need for two separate annealing process steps thereby resulting in decreased fabrication time and cost. The dielectric encapsulant 30 may be of silicon dioxide ($SiO_2$), silicon nitride (SiN), polyimide or silicon oxynitride (SiON). Deposition, as by CVD or plasma deposition (PECVD), of these dielectrics is preferred except for polyimide which may be spun on as with photoresists.

The next step is the formation of ohmic contacts 32 on the surface 26. This may be accomplished in a number of ways. In one method the annealing encapsulant 30 is removed in hydrofluoric acid and contacts 32 are formed by evaporation and liftoff. The lift-off step is performed in a manner similar to that discussed hereinbefore with respect to the formation of the etch mask 22.

Figure 6:
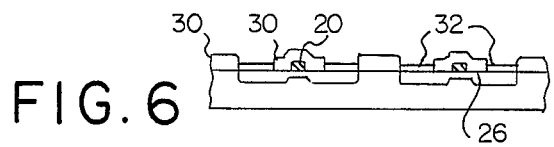

In a second preferred method as shown in FIG. 6, the annealing encapsulant 30 is left in place on the wafer 11 and embedded contacts 32 are formed by plasma etching the ohmic contact patterns through the encapsulant to the surface 26, then evaporating the metallization into the etched pattern and lifting off the pattern. Again, a conventional liftoff procedure may be employed for this step.

Preferred materials for the contacts 32 are a layered structure of 150 Å nickel, then 200 Å germanium and then 2000 Å gold, although a first layer of a gold-germanium compound overlayed with nickel would also be suitable. While the method employing removal of the encapsulant is simpler from a processing standpoint, the second method has the advantage of retaining most of the encapsulant and thus providing more complete gate passivation, leading to greater device reliability. With either approach, the material of the contacts 32 may be deposited by sputtering rather than evaporation, with the advantage of better inherent surface cleaning and more reproducible contact properties.

In either case, the contacts 32 are alloyed into the GaAs surface 26 by rapidly heating to about 380° C. and holding this temperature for 10 to 30 seconds, preferably with quartz-halogen tungsten lamps.

Figure 7:
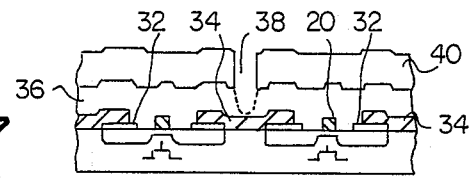
Figure 15:
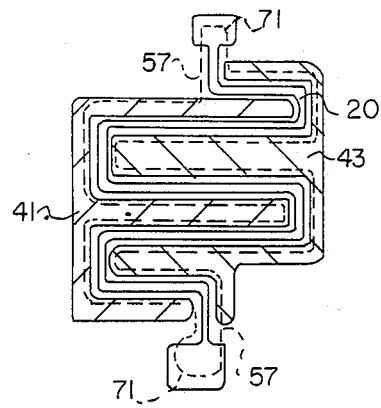
FIG. 15 illustrates a GaAs FET having a non-critically aligned second layer of gate metallization over a first layer of refractory gate material.

Referring to FIG. 7, after the ohmic contacts 32 are alloyed, a first-level conductive interconnect metal 34 is formed on the surface 15 and patterned by a liftoff process. This metal layer 34 overlays the ohmic contacts 32 and makes connection to selected gate pads at the end of each selected gate. FIG. 15 illustrates a serpentine gate 20 having a gate pad 71 at each end of the gate. The TiW gate metal itself is not useful for circuit interconnections because of its high resistivity, so the conductive layer 34 serves this purpose. The preferred materials for the layer 34 are either titanium-gold, titanium-paladium-gold or titanium-platinum-gold.

Additional levels of interconnect (not shown) may be accommodated by coating the structure with an interlayer dielectric 36, providing a patterned photoresist layer 40 and etching apertures 38 through the dielectric 36 at interlayer contact locations. The next level of interconnect 35 is shown in FIG. 1. As explained later, this multilevel metal implementation may conveniently be planarized in a number of alternative process options.

Figure 8:
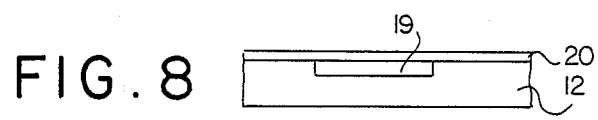
FIGS. 8-10 show sequential stages of GaAs FET structure in a processing operation according to one embodiment of this invention.

Referring to FIG. 8, there is shown a first step in the process of fabricating a self-aligned field-effect transistor according to another aspect of the present invention. Essentially, a substrate 20 is employed. The substrate 12 may typically be gallium arsenide (GaAs) which is initially cleaned in suitable solvents and then etched to remove a portion of the substrate which may have been damaged by the use of a mechanical slurry polishing process. Techniques for preparing substrates are well known. As indicated, the substrate 12 may be gallium arsenide but any suitable semiconductor material may also be employed. After preparation of the substrate 16, one forms an active channel area 19 for the FET device which channel is fabricated according to conventional techniques. The formation of the active channel area 19 may be accomplished by epitaxial layer growth on the substrate which is then followed by electrical isolation of the intended device areas.

Alternatively, one can employ selective ion implantation by utilizing suitable dopants in desired regions of the semiconductor. The entire surface is then coated with a thin layer of suitable metallization 20 having sufficient thermal stability to withstand annealing at high temperatures in the range of 750° to 850° C. for a furnace anneal and up to about 1050° C. for rapid thermal processing without degradation of its Schottky barrier properties.

As seen from FIG. 8, the metallization layer 20 is the first level gate metal. Examples of Schottky gate metallizations as 20 which are suitable for this purpose are titanium-tungsten nitride, tungsten nitride and tungsten silicide. It is understood, however, that any metallization which will survive the annealing step to be described may be used. Essentially, FIG. 8 then depicts a cross-sectional view of the device after the completion of the above-noted steps.

Figure 9A:
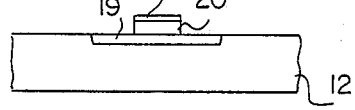
Figure 9B:
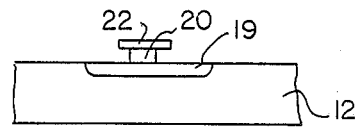

Referring to FIGS. 9a, 9b, there is shown the second step in the process whereby like reference numerals depict corresponding parts. In FIG. 9a, the first level gate metallization layer 20 is patterned into a gate electrode structure (also designated 20) for the device. The preferred technique is to define a metal etch mask 22 by a method such as conventional evaporation and liftoff as previously described. The metal etch mask that is designated generally by numeral 22, can consist of nickel, although aluminum and gold are also suitable for this purpose. In any event, after the etch mask 22 has been formed, excess gate metal is then removed by plasma or reactive-ion etching thus leaving the gate metal 20 only where masked by the etch mask 22, as shown in FIG. 9a.

A three step RIE operation can be performed to transfer the etch mask pattern into the refractory metal film. The outstanding characteristic of this etch process is its self-limiting undercut of reproducible dimensions. The operation is as follows:

(1) a brief argon etch under conditions of low pressure and high power
20 mTorr, 0.4 W/cm$^2$ (2) a CF$_4$ etch at medium pressure and power of sufficient length to remove the refractory metal from the unmasked regions of the wafer
40 mTorr, 0.2 W/cm$^2$ (3) a CF$_4$:O$_2$He (40:10:50 partial pressures) etch at high pressure and low power to produce the desired undercut
200 mTorr, 0.08 W/cm$^2$ The wafer is preferably not exposed to atmosphere but is kept in vacuo between successive etch steps.

In the first step, the wafers are sputter cleaned by energetic argon ion bombardment. The duration of this step is determined to be that necessary to remove 20 nm of refractory metal. This has two benefits. First a very thin film of the etch mask metal in intimate contact with the refractory metal may surround all etch mask features. Such thin films are the result of a non-ideal liftoff patterning process. They may be thin enough to preclude observation by visual inspection, yet still thick enough to serve as effective etch masks in the RIE process. Therefore, they present an unobservable source of variability in the undercut dimension of the T-gate. The first step will remove this undesirable metal. Second, contaminants or oxides present on the surface of the refractory metal can initially inhibit etching of the film, resulting in an induction time for the etch. The sputter etch cleans the refractory metal surface thereby minimizing etch induction time and producing a more consistent surface for the initiation of the subsequent RIE step.

The conditions of the second step are chosen to produce anisotropic profiles in the etched refractory metal and no measurable undercut. This step simply reproduces the etch mask dimensions in the underlying refractory metal film, as shown in FIG. 9a. It is noted that this process step is tolerant of an excess etching time since the consequence might be a slight undercut of the mask. But, due to the anisotropic nature of the etch, this is not of great concern. Optical endpoint detection could conveniently be employed to determine when the GaAs surface has been cleared of exposed refractory metal.

The third step is a self-limiting etch which undercuts the etch mask by a reproducible amount. The etch parameters may be adjusted to tailor the undercut dimension for a particular application. For the etch conditions set forth above, and for a refractory layer 20 having a thickness of about 2000 Å and an etch mask 22 having a width of about 1.4 micrometers, the self-limiting undercut of the etch mask 22 is about 0.4 micrometers on each side at the gate. Thus, the gate length of 0.5 micrometers results. If the etch mask dimension is changed, so is the resulting gate dimension, since the 0.4 micrometers undercut is still provided. In another example, where the second etch step was permitted to overetch somewhat longer than in the above example, it was found that the undercut of the etch mask was about 0.3 micrometers. Thus, it can be seen that varying one aspect of the etch process can alter the extent of self-limited undercut. Helium was selected as an inert gas due to its longer mean free path than Argon's. It is believed that other inert gases could be employed.

This three step process has been found to cause the gate 20 to have a tapered shape where the gate length is shorter than the length of the gates intersection with the mask 22. While the cause of this tapering is not fully known, it has been confirmed that reproducible gate lengths of less than the masks' dimension are obtainable. It is advantageous to have this tapered gate profile because adhesion to the mask is enhanced by the larger area at the top of the gate. If too small an area remains, the mask would peel off. Also, for a given gate length, the tapered profile provides a larger cross-section and thus lower resistance.

Figure 10:
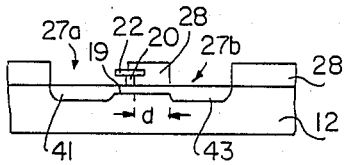

After the T-gate formation, a selective self-aligned n+ ion implantation may be carried out to create high conductivity regions in the semiconductor wafer for low resistance source and drain contacts. The T-gate comprises the self-aligned implant mask (etch mask 22) while a patterned photoresist mask 28 provides for device isolation. Referring to FIG. 10, this further step in the process is depicted. After selectively etching the gate metal and removing the excess metal by plasma or reactive-ion etching, the wafer is then coated with a photoresist layer 28 and patterned according to conventional techniques to define implant windows 27a, 27b including openings in the photoresist on both halves of the device. Suitable dopant ions are then implanted into the semiconductor in the region of the openings thus forming an asymmetrical device structure. In the situation illustrated, an n-type channel 19 is implanted with a second n-type implant to form n+ regions 41, 43 such that the gate is adjacent to an n+ region 41 on its source side, but separated from the n+ region 43 by some distance "d" on the drain side. The preferred distance for this separation "d" is about 1 micrometer but it could be as little as 0.5 micrometers and as much as the gate-to-drain electrode distance. Essentially, the preferred dopant ion is silicon, although any n-type dopant ion may be used. As one can see from FIG. 10, the areas 41 and 43 which respectively constitute the source and drain regions of the FET device are heavily doped by means of the dopant ions and are n+ regions, indicating high conductivity relative to the channel.

Figure 11A:
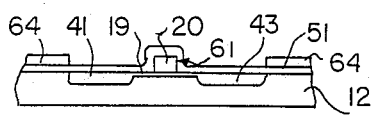
FIGS. 11-13 are cross-sectional views depicting additional steps necessary to provide a field-effect device according to a manner of practicing this invention.

FIG. 11a depicts the next step in the process. In FIG. 11a, the etch mask material 22 has been removed and the first level gate metal area as 20 is retained. Again corresponding numerals depict the like parts. After removing the first level gate metal etch mask 22, the wafer is encapsulated with a suitable dielectric material 51 in such a way as to cover the gate electrode structure 20. The thickness of the dielectric material 51 is preferably greater than the thickness of the gate electrode. A preferred encapsulant is silicon oxynitride (SiON), although silicon dioxide and silicon nitride are also suitable for this purpose.

At this point in the process, it is possible to select a process option which greatly improves the reproducibility of complex circuits. Since EFET's and DFET's may be desired in a single circuit, it is valuable to be able to optimize the process for performance of both device types.

By employing a dielectric encapsulant 51 suitable not only as an anneal cap, but also as an implant mask, it is possible to provide an additional self-aligned implant. FIG. 11a illustrates encapsulant 51 which may be SiON. In order to obtain a suitable self-aligned implant by employing SiON layer 51, it is necessary to ensure that the thickness of the layer will not mask ion implantation at the selected implant energy along those locations where layer 51 is over a horizontal surface. However, where layer 51 is adjacent a vertical sidewall, such as the sidewall 61 of the gate 20, the vertical thickness of layer 51 is dependant upon not only the height of the gate but also the layer thickness. Thus, a vertical implant will be masked from the portion of the channel adjacent the gate and will be admitted into the channel at intermediate regions 66, 68 between the earlier n+ implanted regions 41, 43 and the remaining channel region 19.

In order to obtain this result, the encapsulant 51 is conformally provided such that it has a vertical thickness on horizontal surfaces which is about the same as its horizontal thickness on vertical surfaces. SiON, $Si_3N_4$ and $SiO_2$ can all be conformally applied and their thickness on both horizontal and vertical surfaces will be nearly identical. Using SiON as an example, a conformal layer 51 of about 100 nm thickness is provided as shown in FIG. 11a, by plasma enhanced chemical vapor deposition. This results in a vertical thickness of SiON of 100 nm over horizontal surfaces, and a 100 nm wide spacer of SiON adjacent the gate having a vertical height (thickness) of about the gate height (200 nm) plus the 100 nm thickness of the SiON layer. Thus, about 300 nm of SiON, measured vertically, is provided adjacent the gate. This spacer has sufficient thickness to substantially prevent vertical ion penetration therethrough during an ion implant step where the implant energy is selected to be about 100 Kev and where the implanted ions are silicon.

The transition region is laterally spaced from the gate. The use of the sidewall as an implant mask provides a distinct benefit in avoiding short channel effects. Short channel effects may be encountered if the transition regions contact the gate metal. If the undercut is 0.4 um, it is imperative to use the transition region if an EFET is to work since a source to gate dimension of about 0.3 micrometer or more is generally not functional. A desirable distance from the transition region to the gate is less than 0.1 micrometers but, in order to avoid short channel effects, the transition region should be laterally spaced from the gate.

Figure 11B:
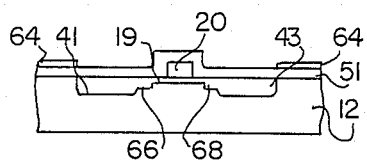

FIG. 11b illustrates the tapered implant profile including intermediate regions 66, 68 having an n' doping level (about $3-8 \times 10^{17}$ ions/cm$^3$), highly doped regions 41, 43 having an n+ doping level (greater than about $1.0 \times 10^{18}$ ions/cm$^3$) and the lightly doped channel 19 (about $1-4 \times 10^{17}$ ions/cm$^3$), assuming implant thickness or depths of less than about 0.2 micrometers for the channel. The n' implant is masked by photoresist 64 for ensuring that conductive n-doped regions of the substrate are not formed to provide unintentional interconnections, via the substrate, of adjacent devices. By masking the substrate with a suitable thickness of photoresist, device isolation is maintained. The gate (and overlying SiON) masks the channel 19 between the spacers to prevent extra implantation into the channel.

In an overall process flow as described herein, the benefits of this process option can be clearly seen when the channel is formed by implanting silicon at 90 Kev through 85 nm of PECVD SiON followed by removal of the SiON and direct deposit of 200 nm of T:WN onto the GaAs channel by reactive sputtering in an atmosphere of 25% $N_2$ in Ar. An Ni etch mask 150 nm thick is formed by evaporation and liftoff to define the gate. The three step self-limiting undercut T-gate forming sequencer described with respect to FIG. 9 follows and silicon is implanted at 120 Kev into bare GaAs to form n+ regions. Then the etch mask is chemically removed. 100 nm of PECVD SiON is conformally deposited to provide an anneal cap and self-aligned implant spacers for the following 100 Kev silicon implant. An 810° C. anneal completes the sequence. It is noted that the purpose of the anneal is to activate all of the implanted silicon.

The photoresist 64 is stripped following the n' implant and the processing continues as explained below. It is noted that the taped profile is a process option and is not further discussed in the following process description. However, the following process steps are generally compatible with this optional step and the lack of further discussion is not to be considered an indication that this process option is not included or available. Furthermore, by covering selected devices with photoresist 64, it is possible to selectively provide some devices with the tapered profile while other devices on the wafer retain the two level (channel:n+ implant) profile.

Figure 12:
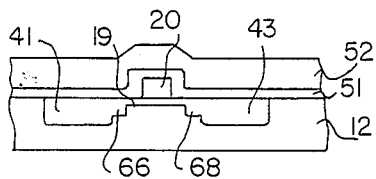
Figure 14A:
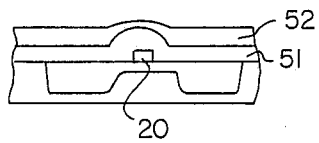
FIGS. 14a, 14b and 14c show an alternative process option to that shown in FIGS. 11-13.
Figure 14B:
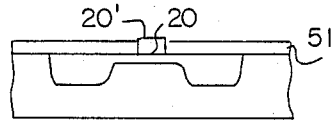
Figure 14C:
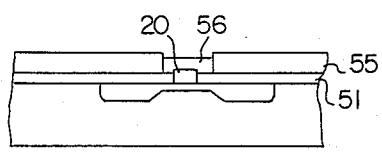

Referring to FIG. 12, there is shown the next step in the process. After annealing, the annealed cap is planarized. This is accomplished by first spinning a thick layer, perhaps 2000 to 5000 angstroms, of a planarizing material 52 such as polyimide or photoresist onto the encapsulated wafer thus forming the layer 52. It is preferred that the photoresist's thickness be at least as thick as the height of the first level gate metal. The coated wafer is then plasma etched in an admixture of $CF_4$ and $O_2$ in which the ratio of the two gases is adjusted so that the dielectric encapsulant 51 and the planarizing layer 52 have approximately equal etch rates. The wafer is etched until all of the photoresist 52 has been removed in addition to the bulges in the encapsulant 51 caused by the underlying first level gate metal. The exact ratio of the $CF_4/O_2$ mix needed to establish a unity etch rate ratio is dependent upon the refractive index of the encapsulant. In one preferred manner of practicing the invention, polyimide is used as the planarization dielectric. Polyimide has been found to provide a lower $C_{gs}$ and lower $g_m$ than results from the use of SiON. In design of circuits using devices made with polyimide, the lower $C_{gs}$ more than compensates for the reduced $g_m$ and the circuit performance is improved overall. These differences are believed to be due to, at least in part, surface charge and interlayer stresses. In a preferred manner of practicing the invention, the planarizing etch continues until the top surface of the first level gate metal is exposed along substantially its entire lateral expanse. This may be facilitated by continuing the $CF_4/O_2$ etch long enough to overetch the dielectric resulting in a structure where the top surface of the gate protrudes above the level of the surrounding dielectric. This obviates the need for critically aligning a mask with the dielectrically covered gate portion for contact window formation. This process sequence is shown in FIGS. 14a–14c where the cap 51 and planarizing layer 52 shown in FIG. 14a are etched until the top 20' of gate 20 is cleared along its entire lateral expanse. The etch is halted before the dielectric 51 is consumed or etched through at locations other than the gate metal tracks such that a continuous dielectric isolation of the channel is provided, except for its contact to the gate. FIG. 14c shows a liftoff mask 55 used for non-critically aligning a supplemental gate conducting layer with the refractory gate. The misalignment tolerance of this process is excellent.

The step of applying the supplemental gate layer to the top portion of the underlying gate layer is substantially similar to that described previously with respect to FIGS. 3b and 4. Once the structure of FIG. 14c is obtained, the supplemental gate conducting layer is evaporated onto the structure and upon chemically etching away the mask 55, excess metal from the supplemental gate conducting layer is lifted off. The conducting layer 56 which remains on the entire lateral expanse of the gate is similar in function to layer 57 illustrated in FIGS. 13a–13c and is described below in common with layer 57.

Figure 13A:
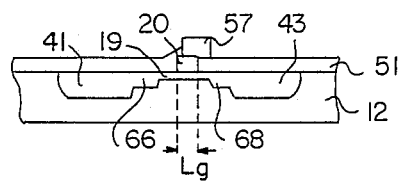

Referring to FIG. 13A, there is shown the alternative step in the process where windows are patterned in the encapsulant 51 over the refractory gate metal area 20 by realigning the gate mask and patterning photoresist material thereupon followed by chemically etching the encapsulant. In this approach, it is important that the etch be terminated before any portion of the GaAs is exposed. According to the preferred manner of practicing this aspect of the invention, a non-critically aligned photoresist mask is then provided over the patterned encapsulant 51 and patterned to expose substantially the entire top surface of the gate which was previously etched to clear the top of the gate of encapsulant 51.

Figure 13B:
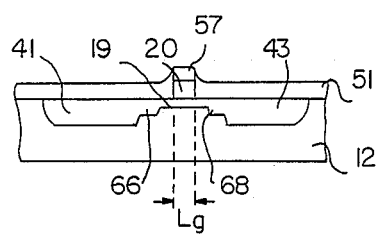

Gold 25 is subsequently evaporated onto the photoresist and gate and lifted off with the photoresist to produce a non-critically aligned ($\pm 0.5$ micron) second layer (or supplemental layer) of gate metal area 57 which is firmly bonded to the exposed first level gate area 20 which includes substantially the entire top surface of the first layer of the gate metallization. The technique allows the gross misalignment between the first layer 20 and the second layer 57 of gate metallization without increasing the FET gate length designated by $L_g$. This essentially is depicted in FIG. 13b. Hence, as one can see, the metallization area 57 can be substantially misaligned with respect to the first metallization layer 20 and still produce a viable operating device. This is a very beneficial aspect of the above-described feature of the invention since increasing $L_g$ severely degrades FET performance.

Figure 13C:
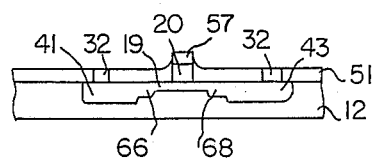

Referring to FIG. 13C, additional windows are then patterned in the encapsulant 51 over source and drain regions 41 and 43 on either side of the gate electrode 20. Ohmic metallization 32 is provided in the openings, for instance, by another evaporation and liftoff sequence. The preferred material for these ohmic contacts 32 is a layered structure or a mixture of gold, germanium and nickel. After patterning, the wafer is heated to a temperature between 350° to 500° C. to alloy the ohmic contacts resulting in the finished self-aligned gate FET exclusive of external connections to the other circuit elements. This is shown in FIG. 13C which essentially depicts a completed device.

It is noted that the two layer metallization, consisting of layers 20 and 57, can be considered to be the gate of the FET device. More accurately, however, the gate consists of layer 20 while layer 57 provides supplemental conductivity and might more appropriately be considered a part of the gate contact structure. Layer 57 has a very low sheet resistance which is typically 0.06 ohms/sq. and could also be used as the first level interconnect metal if the FET is incorporated in an integrated circuit. Hence, as one can see from FIG. 13C, one has access to the source and drain of the device via the ohmic contacts 32 and access to the gate electrodes via the second metallization layer 57. This, of course, is substantially different from the implementation previously described with respect to FIG. 7 where the first level interconnect is connected to gate pads at the end of each gate finger. The provision of the second layer 57 of metal having low sheet resistance over substantially the full gate (rather than only at gate contact locations) provides greatly improved device characteristics.

As is evident from the above, in circuits where multi-level metal interconnect is to be employed, it is possible to obtain the advantage of reduced gate resistance in an already existing metallization step without resulting in increased gate length and without requiring line resolution to the dimensions of the gate length. The two layer gate/gate contact structure and the planarizing sequence provide advantages over prior structures and processes.

To form a second-level interconnect metallization, reference is made to FIG. 7 where the wafer may be coated with a suitable dielectric material to form a layer 36 over the planarized surface. This permits the second level metal to be a global interconnect. An organic material such as polyimide may be used for the dielectric material. Other dielectric materials include inorganic materials such as plasma-deposited SiN or SiON. Openings 38 are opened in the dielectric layer 36 by plasma etching through a patterned photoresist layer 40. The openings 38 permit contact between the additional level of interconnect metallization 35 shown in FIG. 1 with the underlying first-level interconnect metal 34, the gate 20, or the dual layer metal 12, 25 shown in FIG. 13c.

The second-level interconnect metal is either deposited on a patterned etchable layer and patterned by liftoff or is deposited over the interlayer dielectric and patterned by etching, in such a way that it fills the via openings and contacts the first-level metal, as generally shown in FIG. 1.

Additional levels of interconnection may be formed in the same way, and, if desired, the wafer can be given a final dielectric passivation coating for scratch protection.

The wafer is then diced into chips.

Another aspect of the present invention involves the process of efficiently providing asymmetrical spacing of the source and drain implants from the gate. Referring again to FIG. 8, there is shown in general a semiconductor wafer or substrate 12 containing an active channel region 19. The fabrication process essentially begins with the formation of the active channel area for the FET. This may be accomplished by epitaxial layer growth on a suitable substrate, followed by electrical isolation of the intended device area, or alternately, by selective ion implantation of suitable dopants in desired regions of the semiconductor. The entire surface is then coated with a thin layer 20 of suitable metallization having sufficient thermal stability to withstand annealing at temperatures in the range 750° to 950° C. without degradation of its Schottky barrier properties. Examples of Schottky gate metallizations suitable for this purpose are titanium-tungsten, titanium-tungsten nitride, tungsten nitride and tungsten silicide, although any metallization which will survive the anneal step may be used.

Referring to FIG. 9, the next processing steps are shown. The gate metallization 20 is patterned into a gate electrode structure for the device. The preferred technique is to define a metal etch mask 22 by evaporation and liftoff as previously described.

Referring to FIG. 10, the wafer is then coated with a photoresist 28 which is patterned to have openings 27a and 27b on respective source and drain sides of the device. Suitable dopant ions are then implanted into the semiconductor in the region of the openings 27a and 27b thus forming an asymmetrical device structure with the gate adjacent (but for the overlap of mask 22) to the heavily doped region 41 on its source side but separated from the heavily doped region 43 some distance "d" on the drain side. The preferred distance for this separation is about 1 micrometer, but it could be as little as 0.5 micrometers and as much as the gate-to-drain electrode separation distance. The preferred dopant ion is silicon, although any dopant may be used. N-type doping is generally preferred and this can be obtained with silicon by meeting the anneal schedule criteria for n-type activation as previously described. This then suggests the utilization of a TiWN gate which can withstand an 810° C. anneal for 20 minutes without substantial degradation.

In an alternative process sequence, the etch mask of, for instance, nickel, is asymmetrically located relative to the channel resulting in an initial asymmetry of the device which can be supplemented by asymmetrically providing photoresist to further increase spacing from the gate 12 to the n+ drain region created by the n-type implant used for increasing the source and drain doping.

Figure 16:
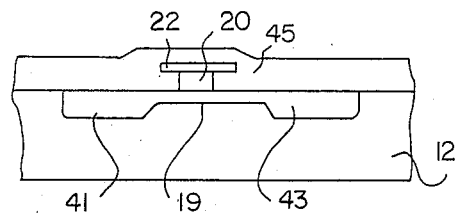
FIGS. 16 and 17 show another alternative process option to that shown in FIGS. 11-13.

As shown in FIG. 16, the wafer is then encapsulated with a suitable dielectric material 45 in such a way as to cover the gate electrode structure 20, 22. A preferred encapsulant is silicon oxynitride, although silicon dioxide and silicon nitride are also suitable for this purpose. The metal etch mask 22 may be removed before performing this encapsulation, although if desired, it may be left in place in order to reduce the overall electrical resistance of the gate electrode, provided the resulting structure is thermally stable in the subsequent annealing step. The encapsulated wafer is then annealed at a temperature and time sufficient to remove ion implant damage from the semiconductor material and to activate the implanted dopant ions. Preferred annealing temperatures are in the range from 750° to 900° C. if done in a conventional furnace system, and 800° to 1000° C. if done in an infrared lamp system by rapid thermal annealing. When silicon is employed as the dopant and n-type activation is desired, optimum n/p activation is obtained at a temperature of about 810° C. if a 20 minute furnace anneal is utilized.

Figure 17:
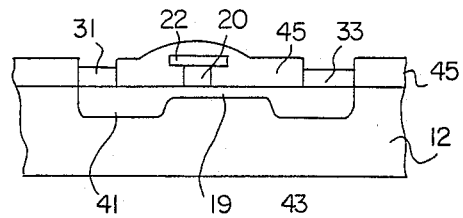

Referring to FIG. 17, after annealing, windows 31' and 33' are patterned in the encapsulant on either side of the gate electrode, and ohmic metallization 31, 33 is deposited in the openings by evaporation and liftoff. The preferred material for these ohmic contacts includes gold, germanium, and nickel. After patterning, the wafer is heated to a temperature of between 350° and 500° C. to alloy the ohmic contacts, resulting in a finished self-aligned gate FET exclusive of external interconnections to other circuit elements as shown in FIG. 17.

Referring again to FIGS. 1-7, processing of a semiconductor wafer 11 according to another aspect of the invention is commenced as described with respect to FIG. 2 for the cleaning and smoothing steps. Also, dielectric layer 14 and photoresist layer 16 are provided and alignment registration marks 13 are formed, all as described previously, and the additional processing described with respect to FIG. 3a is carried out.

Photoresist layer 18 is formed on the surface 15 as shown in FIG. 3a. The photoresist layer 18 is patterned to form window 17 for selective ion implantation through the dielectric layer 14 into the underlying GaAs substrate 12. The ion implantation step is performed through the window 17 to form the implanted region 19.

After completing the desired selective implant steps, the dielectric layer 14 is removed in hydrogen fluoride (HF). A metallization layer 20 is formed on a surface 26 which is the implanted surface of the wafer 11, all as shown in FIG. 3b. The metallization layer 20 is formed of titanium-tungsten nitride ($TiWN_x$ or TiWN for convenience). No stoichiometry is implied by this notation. This layer 20 of $TiWN_x$ departs from the metal layer 20 previously described with respect to FIG. 3 where the layer 20 was formed by the sputter deposition of titanium-tungsten to a depth of 2000 Å.

Advantages exist in the use of $TiWN_x$ as a gate material which were not available through the use of TiW. An unexpected benefit obtained by the use of $TiWN_x$ is the improved lifetime of operating circuits due to the stability of $TiWN_x$. With TiW, it is common for a TiAs layer to gradually form at the Schottky junction, resulting in gradual conversion of the Schottky junction to an ohmic-like contact. Since $TiWN_x$ has been found to be more stable than TiW when contacting GaAs, $TiWN_x$ forms a longer lasting Schottky junction. This transition may occur in as short a time as 90 days, although more typically it would not be evident for a year or more. $TiWN_x$ has been found to be substantially free from TiAs formation over periods simulating many years of operation. In fact, it appears that $TiWN_x$ is more stable than $TiAs_x$ and thus that $TiAs_x$ will not be formed in the Schottky junction.

A second, and much more immediate factor, is the relative stability of $TiWN_x$ compared with TiW at the elevated temperatures encountered during sputtering of $TiWN_x$ and during the anneal and activation steps in FET manufacture. TiAs formation at the Schottky junction in TiW gate structures is detrimental to Schottky quality. Thus, the use of $TiWN_x$ as a Schottky gate provides superior characteristics relative to gates of TiW.

These results are counterintuitive since one would generally expect a poorer gate to result from a nitrided TiW than from the TiW itself due to the increased resistance. The unpredicted improvement in the Schottky junction resulting from reduced TiAs formation more than compensates for the deterioration in gate resistance caused by the addition of nitrogen into the TiW.

One method of formation of the layer 20 is accomplished by reactively sputtering a TiW (30 atomic percent Ti) target in a nitrogen/argon plasma. The metallization layer 20 acts as a diffusion barrier between the gold which will be deposited on the metallization layer during subsequent processing, and the gallium arsenide substrate 12. Unexpectedly, it has been found that by changing the atomic percent of nitrogen in the TiWN layer, dramatically increased efficiency of the layer as a diffusion barrier can be achieved. An N/(N+Ar) gas flow ratio of ¼ is preferred, but a range of 1/10 to ½ will provide advantage. By maintaining the nitrogen ratio in this range, an atomic percent of nitrogen results in the metal layer which enables the metallization layer 20 to withstand a subsequent annealing step of approximately 850° C. for at least 20 minutes without breakdown of its barrier function. By selecting the appropriate gas flow ratio within the above range, the interlayer stress between the TiWN and GaAs layers is maintained at a low level. This allows submicron length Schottky gate electrodes to stay in place during, for instance, the wafer cleaning and anneal steps, when greatest peeling forces are encountered.

Referring to FIG. 4, the next step in wafer processing is the patterning of the T-shaped structures 24 which begins with the formation of another masking level 22 on the $TiWN_x$ layer 20. This masking level is a metal etch mask 22 fabricated preferably from nickel or gold and formed, for instance, by evaporation and liftoff in the following manner. A high resolution positive photoresist mask 21 is positioned on top of the $TiWN_x$ layer 20. The positive photoresist mask has openings which define the regions where the metal is to be deposited which will form the etch mask 22. The metal for the etch mask 22 is evaporated on the positive photoresist mask in such a manner that the openings in the mask are filled. Filled in this instance simply means that the metal does a fairly good job of covering the exposed $TiWN_x$ in the opening in the mask. After evaporation, the photoresist mask is lifted off and the metallization remaining on the $TiWN_x$ layer 20 defines the metal etch mask 22. As indicated, a preferred material for the etch mask 22 is gold and if the gold etch mask 22 is not removed, but remains in place, it will greatly reduce the resistance of the gate.

The $TiWN_x$ layer 20 is then removed from those areas where it is not covered by the gold mask 22. Most conveniently, the exposed $TiWN_x$ is reactive-ion etched, using the metal mask 22 as an etch mask, in a fluorine-based plasma etch. The plasma will etch the layer 20 in the regions not covered by the metal etch mask 22 and will also undercut the masked region to form T-shaped structures 24 as shown in FIG. 4. The amount of plasma undercut can be controlled by varying the plasma etch parameters. This can be accomplished by initially etching at low pressure to set an anisotropic profile, then increasing the pressure to achieve a faster plasma undercut, or by using an etch which is anisotropic until the horizontal surfaces are cleared of Au and then rapidly undercuts, such etch being optically monitored so that it may be promptly stopped when sufficient undercutting has occurred. The self-limiting etch previously described can be employed for this etch and will provide an easily controllable and reproducible undercut.

Following the gate patterning, a photoresist mask 28 is formed on the surface 26 to define regions 29 for self-aligned ion implant as shown in FIG. 5. The term "self-aligned" is used since the mask 22 acts as a barrier to ion implantation by an ion beam and thus defines the limits of heavily doped regions in the substrate. While n-type doping levels are used for the initial channel implant, much higher levels of doping (n+) are used during this subsequent implant step to form source and drain regions and to facilitate ohmic contact to the source and drain regions.

The photoresist mask 28 having windows 27 for the high-dose ion implant is formed on the surface 26 of the wafer 11. The gold mask 22 serves as a self-aligned structure for the ions which are directed to the window regions. The ions will be implanted in the regions at both sides of the T-shaped structures 24, with a controllable lateral separation between the gate's edges and the adjacent n+ regions. The metal etch mask 22 allows the creation of an implant-to-implant spacing larger than the gate length. This is an important feature of an optimized GaAs SAG process, since only by controlling the difference between these two dimensions can the device be optimized in the trade-off between gate capacitance and breakdown voltage versus parasitic series resistance. As previously explained, the photoresist 28 may be asymmetrically located relative to the gate to provide increased spacing of the n+ region (on the drain side of the gate) from the gate metal to further optimize device features, especially gate to drain capacitance. By using photoresist rather than the gate itself or another metal layer contacting the gate to laterally space the drain-side n+ implant from the gate, the capacitive coupling from the gate to the drain is still further reduced.

The n+ implant is masked from the region of the gate structures 24 by the etch mask 22, with the separation of each gate edge from the adjacent n+ region determined by the plasma undercut of the gate metal and any extra lateral drain-side masking provided by photoresist layer 28. The plasma undercut can be controlled accurately enough to allow optimization of the gate structure with respect to both gate capacitance and series resistance.

The wafer is then covered with approximately 3000 Å or less of a dielectric encapsulant 30. If an n' transition region is to be implanted to permit lower resistance between the n+ region and the n channel, the previously described process option is implemented and the structure is then annealed at approximately 850° C. for 20 minutes. The encapsulant 30 protects the GaAs wafer 11 from disassociation since the arsenic may vaporize at the high annealing temperature. Because the atomic percent of the nitrogen in the $TiWN_x$ enables the layer 20 to have unusually high thermal stability, only one annealing step for the channel, transition region and n+ region ion implants is needed. As discussed above, this allows optimum n-type activation of each implant, higher electron mobility, reduced parasitic resistances and superior device characteristics. It also eliminates the need for at least one annealing furnace and the need for separate annealing process steps thereby resulting in decreased fabrication costs. Still further, the TiAs formation typically encountered in prior approaches is not encountered due to the substantially greater stability of $TiWN_x$ relative to TiW and TiAs.

In order to ensure that the barrier properties of the $TiWN_x$ layer 20 are maintained and not severely degraded during subsequent processing of the wafer 11, the dielectric encapsulant 30 is selected to be plasma enhanced chemical vapor deposited silicon oxynitride (SiON) having a refractive index in the range of 1.55 to 1.95. This range of refractive indices is indicative of SiON having a good thermal match, i.e. similar coefficient of thermal expansion, with the gate and GaAs. A 1.55 refractive index is preferred. To establish an index of refraction of the SiON film in the given range, the $N_2O/SiH_4$ gas flow ratio is adjusted during deposition of the encapsulant film. The encapsulant preferably totally encapsulates the gate.

Previously, it was believed that $TiWN_x$ could not function as a diffusion barrier at temperatures above about 500° C. and thus, it was not believed useful in processes which would require high temperature processing after provision of the $TiWN_x$ layer. By employing about 6 to 16 atomic percent nitrogen and less than 20 atomic percent titanium in the $TiWN_x$ composition, the barrier property can be maintained throughout and following an 850° C. anneal having a 20 minute holding time at the 850° C. temperature.

Advantages exist in the use of $TiWN_x$ as a Schottky gate material which were not available through the use of TiW. An unexpected benefit obtained by the use of $TiWN_x$ is the improved lifetime of operating circuits due to the stability of $TiWN_x$. With TiW, it is common for a TiAs layer to gradually form at the Schottky junction, resulting in gradual conversion of the Schottky junction to an ohmic-like contact. Since $TiWN_x$ is more stable than TiW when contacting GaAs, $TiWN_x$ forms a longer lasting Schottky junction. $TiWN_x$ has been found to be substantially free from TiAs formation over periods simulating many years of operation.

A second, and much more immediate factor, is the relative stability of $TiWN_x$ compared with TiW at the elevated temperatures encountered during sputtering of $TiWN_x$ and during the anneal and activation steps in FET manufacture. TiAs formation at the Schottky junction in TiW gate structures during anneal has substantial detrimental results on Schottky quality. Thus, the use of $TiWN_x$ as a Schottky gate provides superior FET characteristics relative to FET's employing gates of TiW.

The diffusion barrier properties of $TiWN_x$ which prevent Au from diffusing into GaAs were previously believed ineffective at temperatures exceeding about 500° C. Thus, where an anneal at 800° or more is to be employed after gate formation, it was not evident that $TiWN_x$ would be suitable. Additionally, the increase in gate resistivity resulting from the addition of N to TiW was a deterent to the use of $TiWN_x$.

In the GaAs industry, it is common practice to do an uncapped anneal with Arsenic overpressure to reduce the effects of As outgassing. Thus, in the standard anneal which is near 800° C. (well above the critical 500° C. range for $TiWN_x$) the barrier properties of $TiWN_x$ would be destroyed.

The encapsulation of the gate has been found to permit annealing at temperatures well above 500° C. without destroying the barrier properties of $TiWN_x$ with respect to Au diffusion into GaAs.

From the processing viewpoint, $TiWN_x$ has been found to be surprisingly tolerant to process variations while still providing excellent Schottky junctions. The process window relating to nitrogen content in the gate is very wide, covering the full range from 6% to 16% atomic nitrogen in the $TiWN_x$. This permits some fairly substantial deviations from process ideals to be tolerated without critically impacting the ultimate device quality. Such flexibility is an important feature in semiconductor manufacturing processes.

The next step following encapsulation is the formation of ohmic contacts 32 on the surface 26. This may be accomplished in either one or two ways. In one method the annealing encapsulant 30 is removed in hydrofluoric acid and contacts 32 are formed.

In another preferred method as shown in FIG. 6, the annealing encapsulant 30 is left in place on the wafer 11 and embedded contacts 32 are formed by plasma etching the ohmic contact patterns through the encapsulant to the surface 26, then evaporating the metallization into the etched pattern and lifting off the pattern. Preferred materials for the contacts 32 include a first layer of a gold-germanium compound overlayed with nickel or a layered structure of nickel, germanium and gold. The contacts 32 are then alloyed into the GaAs surface 26 by rapidly heating to 380° C.–400° C. for 10 to 30 seconds, preferably with quartz-halogen tungsten lamps.

Referring to FIG. 7, after the ohmic contacts 32 are alloyed, a first-level conductive interconnect metal layer 34 is formed on the surface 15. This metal layer 34 overlays the ohmic contacts 32 and makes connection to gate pads provided along the length of the gate.

The layer 34 may be formed by reactively sputtering a TiW target in a nitrogen/argon plasma and by the same process as employed for formation of the layer 20. The Ti of the target has an atomic percent of 30. Here again as in layer 20, the ratio of the $N/(N+Ar)$ flowing into the sputter system is adjusted so that the atomic percent of nitrogen will produce a ratio greater than 1/10 of $N/(N+Ar)$, with a preferred ratio of about ¼.

After deposition of the $TiWN_x$ portion of the layer 34, the wafer 11 is transferred to a vacuum system where either titanium (Ti) or molybdenum (Mo) is evaporated onto the $TiWN_x$. Thereafter gold is evaporated onto the surface of the titanium or molybdenum. If deposition of the gold is carried out by sputter deposition in situ, the intermediate titanium or molybdenum portion of the layer 34 may be eliminated since it serves as an adhesion layer between the sputter deposited $TiWN_x$ (which becomes oxidized upon removal from the sputter chamber) and the evaporated gold.

To form a second-level interconnect metallization, the wafer is next coated with a suitable dielectric material to form a layer 36. An organic material such as polyimide may be used for the dielectric material. Other dielectric materials include inorganic materials such as plasma-deposited SiN or SiON. Contact vias 38 are opened in the dielectric layer 36 by plasma etching through a patterned photoresist layer 40. The contact vias 38 permit contact between the additional level of interconnect metallization with the underlying first-level interconnect metal 34 as shown in FIG. 7. The second-level interconnect metal is deposited and patterned either by liftoff or etching, in such a way that it fills the via openings and contacts the first-level metal, as shown in FIG. 1.

Additional levels of interconnect may be formed in the same way, and, if desired, the wafer can be given a final dielectric passivation coating for added electrical and scratch protection. Of course, conventional air-bridge technology may be used for second (and subsequent) levels of interconnect rather than the approach described above. In the foregoing description, dopants have generally been referred to as n-type. However, it is to be understood that the use of opposite dopant types could also be employed without departing from the invention. Also, where reference is made to implanting of an n-type dopant, it is intended to encompass the implantation of dopants which cause the implanted region to be n-type following activation. Thus, silicon is to be included since proper activation of silicon can cause it to be predominantly n-type after activation.

Also, where implants are referred to as n-type, n' and n+, it is intended that relative conductivity type, after activation, is higher in the n' than in the n and is higher still in the n+ than in the n'. Since this relationship is generally consistent with the relative dopant concentrations in the doped regions, this notation is intended to cover both possible meanings.

While we have described above the principles of our invention in connection with specific apparatus, it is to be clearly understood that this description is made only by way of example and not as a limitation to the scope of our invention as set forth in the objects thereof and in the accompanying claims.

We claim:

1. A process for the manufacture of self-aligned gate GaAs FET's having reduced gate length and improved gate resistance comprising:
   (a) providing a substrate;
   (b) forming a layer of GaAs on said substrate;
   (c) forming an active channel region in said layer of GaAs;
   (d) forming a first patterned gate layer comprising a gate of a refractory metal;
   (e) ion implanting source and drain regions on respective sides of said gate;
   (f) providing a first dielectric layer over said first patterned gate layer and said source and drain regions;
   (g) providing a sacrificial layer of etchable material over said first dielectric layer;
   (h) exposing a top portion of said first patterned gate layer by non-selectively etching said sacrificial layer and said dielectric layer, said top portion having a lateral expanse encompassing said gate;
   (i) providing a non-critically aligned photoresist mask over the dielectric layer and patterning said photoresist mask to expose said top portion;
   (j) forming a second gate layer of a material having low sheet resistivity overlying said photoresist mask and directly contacting said top portion through said photoresist mask; and
   (k) removing said photoresist mask and lifting off said second gate layer overlying said photoresist mask to leave a non-critically aligned second gate layer directly contacting said top portion.

2. A process as claimed in claim 1, wherein said step of planarizing said first dielectric layer comprises covering said first dielectric layer with a sacrificial planarization layer; and
   etching said sacrificial planarization layer and first dielectric layer in an etch environment exhibiting a unity etch ratio with respect to said sacrificial planarization layer and said first dielectric layer to improve the planarity of said first dielectric layer.

3. A process as claimed in claim 1, wherein said source and drain regions are activated prior to said step of covering said first gate layer with a first dielectric layer.

4. A process as claimed in claim 1, wherein said second gate layer forms a first level interconnect.

5. A process for the manufacture of self-aligned gate GaAs FET's having reduced gate length and improved gate resistance comprising:
   (a) providing a substrate;
   (b) forming a layer of GaAs on said substrate;
   (c) forming an active channel region in said layer of GaAs;
   (d) forming a first patterned gate layer comprising a gate of a refractory metal;
   (e) ion implanting source and drain regions on respective sides of said gate;
   (f) providing a first dielectric layer over said first patterned gate layer and said source and drain regions;
   (g) exposing a top portion of said first patterned gate layer by reactive ion etching of said dielectric layer;
   (h) providing a non-critically aligned photoresist mask over the dielectric layer and patterning said photoresist mask to expose said top portion;
   (i) forming a second gate layer of a material having low sheet resistivity overlying said photoresist mask and directly contacting said top portion through said photoresist mask; and
   (j) removing said photoresist mask and lifting off said second gate layer overlying said photoresist mask to leave a non-critically aligned second gate layer directly contacting said top portion.

* * * * *